United States Patent
Matsui (10) Patent No.: US 11,784,464 B2
(45) Date of Patent: Oct. 10, 2023

(54) DIRECTLY MODULATED LASER

(71) Applicant: II-VI DELAWARE, INC., Wilmington, DE (US)

(72) Inventor: Yasuhiro Matsui, Milpitas, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 337 days.

(21) Appl. No.: 17/039,763

(22) Filed: Sep. 30, 2020

(65) Prior Publication Data

US 2022/0102939 A1    Mar. 31, 2022

(51) Int. Cl.
| | |
|---|---|
| *H01S 5/20* | (2006.01) |
| *H01S 5/22* | (2006.01) |
| *H01S 5/125* | (2006.01) |
| *H01S 5/042* | (2006.01) |
| *H01S 5/227* | (2006.01) |
| *H01S 5/028* | (2006.01) |
| *H01S 5/0625* | (2006.01) |
| *H01S 5/343* | (2006.01) |

(52) U.S. Cl.
CPC .......... *H01S 5/2045* (2013.01); *H01S 5/0287* (2013.01); *H01S 5/0424* (2013.01); *H01S 5/125* (2013.01); *H01S 5/2205* (2013.01); *H01S 5/227* (2013.01); *H01S 5/04257* (2019.08); *H01S 5/06256* (2013.01); *H01S 5/06258* (2013.01); *H01S 5/3434* (2013.01); *H01S 5/34313* (2013.01)

(58) Field of Classification Search
CPC ....... H01S 5/2045; H01S 5/0422–0424; H01S 5/1021; H01S 5/12–125
See application file for complete search history.

(56) References Cited

U.S. PATENT DOCUMENTS

| | | |
|---|---|---|
| 4,908,833 A | 3/1990 | Chraplyvy et al. |
| 10,063,032 B2 | 8/2018 | Matsui |
| 2005/0029536 A1* | 2/2005 | Sugitatsu ............ H01S 5/04252 257/E33.068 |
| 2005/0238079 A1 | 10/2005 | Botez |

(Continued)

OTHER PUBLICATIONS

Matsui—Book, Datacenter Connectivity Technologies: Principles and Practice, ISBN 9788793609228, River Publishers Series in Optics and Photonics, Chapter 3—"Directly Modulated Laser Technology: Past, Present, Future" River Publishers Oct. 8, 2018 (86 Pgs.).
Dumitrescu, et al., "Distributed Feedback Lasers with Photon-Photon-Resonance-Enhanced Modulation Bandwidth" Semiconductor Conference, 2012 International IEEE, Oct. 15, 2012, 4 pgs.
Radziunas, et al., "Improving the Modulation Bandwidth in Semiconductor Lasers by passive Feedback," IEEE Journal of Selected Topics in Quantum Electronics, IEEE Service Center, vol. 13, No. 1, Jan. 1, 2007, 8 pgs.
International Search Report and Written Opinion for International Application No. PCT/US2017/021014, dated May 12, 2017, 15 pgs.

(Continued)

*Primary Examiner* — Sean P Hagan
(74) *Attorney, Agent, or Firm* — Blank Rome LLP (57) ABSTRACT

A laser includes a substrate, first and second claddings, a gain medium, and multiple supports. The first cladding is spaced apart from the substrate by an air gap. A thickness of the first cladding in a vertical direction is in a range from 0.05-0.15 micrometers. The gain medium is disposed on the first cladding opposite the air gap. The second cladding is disposed on the gain medium opposite the first cladding. A thickness of the second cladding in the vertical direction is in a range from 0.05-0.15 micrometers. The supports are coupled to each of the substrate, the first cladding, the gain medium, and the second cladding to retain the first cladding, the gain medium, and the second cladding spaced apart from the substrate.

23 Claims, 10 Drawing Sheets

(56) References Cited

U.S. PATENT DOCUMENTS

| | | | |
|---|---|---|---|
| 2009/0041073 A1* | 2/2009 | Matsui | H01S 5/06256 438/31 |
| 2010/0265980 A1 | 10/2010 | Matsuda | |
| 2010/0272133 A1* | 10/2010 | Kato | H01S 5/06256 372/20 |
| 2011/0299561 A1 | 12/2011 | Akiyama | |
| 2013/0308178 A1 | 11/2013 | Matsui | |
| 2014/0269807 A1 | 9/2014 | Matsui | |
| 2014/0321488 A1* | 10/2014 | Chen | H01S 5/02461 438/694 |
| 2016/0064897 A1 | 3/2016 | Higa et al. | |
| 2016/0164257 A1 | 6/2016 | Adachi et al. | |
| 2019/0369328 A1* | 12/2019 | Davies | H01S 5/026 |

OTHER PUBLICATIONS

Troppenz, et al., "40 Gbit/s Directly Modulated Lasers: Physics and Application" Proc. SPIE 7953, Novel In-Plane Semiconductor Lasers X, 79530F (Feb. 16, 2011) 10 pgs.

Chacinski, et al., "Effects of detuned loading on the modulation performance of widely tunable MG-Y lasers," Proc. SPIE 6997, Semiconductor Lasers and Laser Dynamics III, 699709 (May 8, 2008) 9 pgs.

Yamaoka, et al. "239.3-Gbit/s Net Rate PAM-4 Transmission Using Directly Modulated Membrane Lasers On High-Thermal-Conductivity SiC" The 45th European Conference on Optical Communication, Dublin, Sep. 22-26, 2019 4pgs.

* cited by examiner

DIRECTLY MODULATED LASER

FIELD

The embodiments discussed herein relate to a directly modulated laser (DML).

BACKGROUND

Unless otherwise indicated in the present disclosure, the materials described in the present disclosure are not prior art to the claims in the present application and are not admitted to be prior art by inclusion in this section.

The speed of DMLs is partly limited by the ratio between the optical confinement factor to the volume of the active region of the DML. This ratio defines the strength of interaction between the gain and the light. In lasers with normal ridge or buried hetero structures, the ratio is limited by an index contrast between a semiconductor core multiple quantum well (MQW) material and surrounding cladding.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example, a laser includes a substrate, first and second claddings, a gain medium, and multiple supports. The first cladding is spaced apart from the substrate by an air gap. A thickness of the first cladding in a vertical direction is in a range from 0.05-0.15 micrometers. The gain medium is disposed on the first cladding opposite the air gap. The second cladding is disposed on the gain medium opposite the first cladding. A thickness of the second cladding in the vertical direction is in a range from 0.05-0.15 micrometers. The supports are coupled to each of the substrate, the first cladding, the gain medium, and the second cladding to retain the first cladding, the gain medium, and the second cladding spaced apart from the substrate.

In another example, a laser includes a substrate, a waveguide, and a low reflection (LR) mirror. The waveguide is spaced apart from the substrate by an air gap. The waveguide includes a distributed feedback (DFB) active section, a passive section, and a distributed Bragg reflector (DBR) section. The passive section is inline with the DFB active section. The DBR section is inline with the DFB active section. The DFB active section is positioned between the passive section and the DBR section. The LR mirror is formed at a front of the passive section of the waveguide.

In another example, a method to form a laser includes depositing a sacrificial layer on a substrate. The method includes forming a waveguide on the sacrificial layer, the waveguide including first and second claddings and a gain medium positioned between the first and second claddings. The method includes forming a first support structure laterally adjacent to a first side of the waveguide. The method includes forming a second support structure laterally adjacent to a second side of the waveguide that is opposite the first side of the waveguide. The method includes forming an air gap between the substrate and the waveguide by selectively etching the sacrificial layer through holes that pass through a corresponding one of the first and second support structures to the sacrificial layer.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Yamaoka et al. in 2019 describe an air/semiconductor combination to provide a strong index contrast for strong optical confinement of a DML. See Yamaoka et al., 239.3-Gbit/s NET RATE PAM-4 TRANSMISSION USING DIRECTLY MODULATED MEMBRANE LASERS ON HIGH-THERMAL-CONDUCTIVITY SiC, ECOC 2019 Post Deadline paper. According to Yamaoka et al., in state-of-the-art DMLs, the intrinsic 3-decibel (dB) bandwidth, $f_{3dB}$, is limited by, among other parameters, the relaxation oscillation frequency $f_r$, which may in turn be limited by poor thermal dissipation of the DML. Thus, Yamaoka et al. describe a DML wafer attached to a silicon carbide (SiC) substrate to improve thermal dissipation. Yamaoka et al.'s DML wafer is attached to the SiC substrate through a thin layer, e.g., 40 nanometers (nm) thick, of silicon dioxide (SiO$_2$). Such a configuration can induce a strong strain which may adversely affect reliability of such DMLs.

Some embodiments described herein relate to a DML laser structure that provides a strong optical confinement by air with good thermal dissipation while avoiding the strong strain of Yamaoka et al.'s configuration that may adversely affect reliability. DML laser structures as described herein may include a waveguide spaced apart from a substrate by an air gap. The waveguide may include a gain medium such as a MQW core clad by thin first/lower and second/upper claddings. For example, each of the first and second claddings may have a thickness of about 0.1 micrometers, or more generally in a range from 0.05-0.15 micrometers. The waveguide may be suspended apart from or supported above the substrate by pillars or supports of material with high thermal conductivity. As used herein, high thermal conductivity may include thermal conductivities of 0.50 W cm$^{-1\circ}$ C.$^{-1}$ or higher. The supports may be or include indium phosphide (InP) which may have a thermal conductivity of about 0.68 W cm$^{-1\circ}$ C.$^{-1}$. As a result, the relaxation oscillation frequency $f_r$ may not be limited by thermal dissipation characteristics of the DML laser structure.

Some embodiments of the DML laser structure described herein may have a distributed reflector (DR) with weak optical feedback (R) laser cavity design, also referred to as a DR+R laser. The DR+R laser according to some embodiments may be implemented generally in the waveguide spaced apart from the substrate by the air gap to provide strong optical confinement. The DR+R laser may combine aspects of a DR laser and a distributed feedback (DFB)+R laser. Example aspects of DR lasers, DFB+R lasers, and DR+R lasers will be described in turn.

In general, a DR laser may include an active region with a DFB grating, also referred to as a DFB region, and a passive region with a distributed Bragg reflector (DBR) grating, also referred to as a DBR region, optically coupled to the active region. The lasing wavelength of the DFB region is aligned to a long wavelength edge of a reflection profile peak of the DBR region. Intensity modulation of the DFB region is accompanied by frequency chirp, e.g., frequency change toward shorter wavelength as the modulation goes from the bias for the 0 bits to the bias for the 1 bits and toward longer wavelength as the modulation goes from the bias for the 1 bits to the 0 bits. The frequency chirp caused by intensity modulation results in a change in reflection of the DBR region as the frequency of the lasing mode moves up and down the long wavelength edge of the reflection profile peak of the DBR region. When the DR laser is detuned so that the lasing mode is located on the long wavelength edge of the reflection profile peak, the frequency chirp arising from intensity modulation of the DFB region translates to effective enhancement of differential gain, increased modulation speed, and/or increased bandwidth. This may be referred to as the detuned-loading effect. Example DR lasers and additional details regarding the detuned-loading effect are described in U.S. Pat. No. 10,461,503 which is incorporated herein by reference.

In general, a DFB+R laser may include an active region and a passive region that includes a passive waveguide optically coupled to the active region. The active region of the DFB+R laser includes a DFB grating and thus may be referred to as a DFB region. The DFB+R laser also includes a low reflection (LR) mirror on a front facet of the passive region. The LR mirror may have a reflectivity of about 3% or some other relatively low value. The resulting DFB+R laser has a complex cavity design that includes an etalon (formed between a portion of the DFB grating at a front of the DFB region and the LR mirror). The etalon is configured to modify cavity loss dynamically due to frequency chirp as the DFB section is modulated, e.g., by alignment of the lasing mode of the DFB region to the long wavelength edge of a reflection profile peak of the etalon, to leverage the detuned-loading effect and improve differential gain, speed, and/or bandwidth of the DFB+R laser. Example DFB+R lasers are described in U.S. patent application Ser. No. 16/691,549 filed Nov. 21, 2019 which is incorporated herein by reference.

In general, a DR+R laser may combine some aspects of DR lasers and DFB+R lasers. For example, a DR+R laser may include a DFB region, a DBR region, a passive waveguide, and a LR mirror. In some embodiments, the DBR region is optically coupled to a rear of the DFB region and the passive waveguide is optically coupled to a front of the DFB region between the DFB region and the LR mirror. Similar to the DFB+R laser, in the DR+R laser an etalon may be formed between the LR mirror and a front portion of a DFB grating in the DFB region. The DR+R laser may leverage the detuned-loading effect through alignment of the lasing mode of the DFB region to a long wavelength edge of a reflection profile peak of the DBR region and/or of the etalon.

Embodiments described herein may alternatively or additionally leverage the photon-photon resonance (PPR) effect to improve performance. When a DML such as a DFB laser or DBR laser is modulated, modulation sidebands broaden the spectrum of the DML around the main lasing mode. If the side mode of the laser cavity is present within the modulation spectrum, such sidebands can be coupled into the side mode and be resonantly amplified. This effect is called the PPR effect and can enhance the modulation response at around a frequency corresponding to the frequency difference between the main and side modes. The frequency separation between the lasing mode and the PPR mode may be referred to as the PPR frequency. Additional details regarding the PPR effect are described in U.S. Pat. No. 10,461,503 patent and U.S. patent application Ser. No. 16/691,549.

In some embodiments, DR+R lasers or other DMLs as described herein may have a 3-dB bandwidth of 150 gigahertz (GHz) or higher, such as 160 GHz or even higher than 160 GHz. Alternatively or additionally, some embodiments of the DR+R laser or other DMLs described herein may be capable of optical signal transmission at data rates of 200 gigabits per second (Gb/s) or higher.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1:
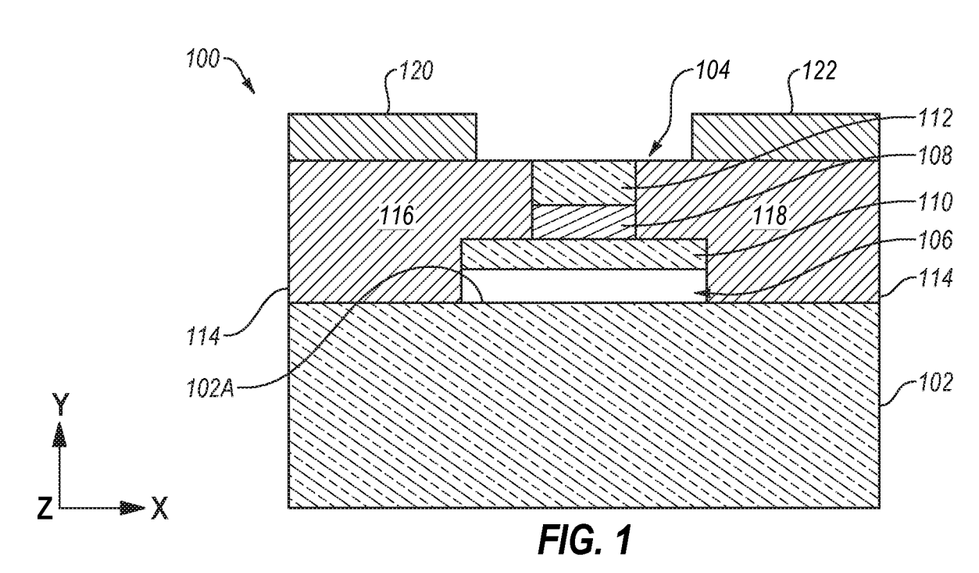
FIG. 1 is a cross-sectional view of an example laser with strong optical confinement by air.

FIG. 1 is a cross-sectional view of an example laser 100 with strong optical confinement by air, arranged in accordance with at least one embodiment described herein. In general, the laser 100 includes a substrate 102 and a waveguide 104 spaced apart from the substrate 102 by an air gap 106.

FIG. 1 additionally includes an arbitrarily defined x-y-z axis in which the x axis is aligned generally laterally in FIG. 1, the y axis is aligned generally vertically in FIG. 1, and the z axis is aligned in and out of the page, or longitudinally, in FIG. 1. As used herein, terms such as longitudinal, length, and variants refer to a light propagation direction of a laser, which is in and out of the page and parallel to the z axis in FIG. 1. Terms such as transverse, height, thickness, top, bottom, vertical, and variants refer to a direction normal to the light propagation direction and normal to a surface 102A of the substrate 102 spaced apart from which the waveguide 104 is formed; this direction is vertical and parallel to the y axis in FIG. 1. Terms such as lateral, width, side, and variants refer to a direction normal to both the light propagation direction and the transverse direction; this direction is lateral and parallel to the x axis in FIG. 1.

The term "light" as used herein is to be construed broadly as any electromagnetic radiation that may be used for optical communication. Accordingly, light may include electromagnetic radiation in the O-band (~1261 nanometers (nm) to 1361 nm), the E-band (~1361 nm to 1461 nm), the S-band (~1461 nm to 1531 nm), the C-band (~1531 nm to 1561 nm), the L-band (~1561 nm to 1625 nm), the 850 nm band, or other wavelength bands.

Returning to FIG. 1, the waveguide 104 includes a gain medium 108, such as a MQW, positioned vertically within the waveguide 104 between first (or lower) and second (or upper) claddings 110, 112. As illustrated, the gain medium 108 is disposed on the first cladding 110 opposite the air gap 106 and the second cladding 112 is disposed on the gain medium 108 opposite the first cladding 110. In some implementations, the first cladding 110 has a thickness in a range from 0.05 micrometers to 0.15 micrometers or a thickness of about 0.1 micrometers and the second cladding 112 has a thickness in a range from 0.05 micrometers to 0.15 micrometers or a thickness of about 0.1 micrometers.

The laser 100 additionally includes multiple supports 114, only two of which are visible in the cross-sectional view of FIG. 1. Each of the supports 114 may be coupled to each of the substrate 102, the first cladding 110, the gain medium 108, and the second cladding 112 to retain or support the first cladding 110, the gain medium 108, and the second cladding 112 spaced apart from the substrate 102.

In some embodiments, first and second support structures 116, 118 are positioned laterally adjacent to opposite sides of the waveguide 104. In more detail, the first support structure 116 is positioned laterally adjacent to a first side (left side in FIG. 1) of the waveguide 104, which first side of the waveguide 104 may include a first side of the first cladding 110, the gain medium 108, and the second cladding 112. The second support structure 118 is positioned laterally adjacent to a second side (right side in FIG. 1) of the waveguide 104, which second side of the waveguide 104 may include a second side of the first cladding 110, the gain medium 108, and the second cladding 112. In some embodiments, some or all of each of the first and second support structures 116, 118 may cooperate with the waveguide 104 to confine light substantially or completely within the waveguide 104 and thus may be considered part of the waveguide 104.

The supports 114 may be integrally formed in the first and second support structures 116, 118. For example, as further described elsewhere herein, the first and second support structures 116, 118 may be formed partially on the substrate 102 and partially on the first cladding 110 and coupled to each of the substrate 102, the first cladding 110, the gain medium 108, and the second cladding 112. When a sacrificial layer between the first cladding 110 and the substrate 102 is removed during fabrication of the laser 100, the first and second support structures 116, 118 thus arranged remain coupled to each of the substrate 102, the first cladding 110, the gain medium 108, and the second cladding 112 to support the first cladding 110, the gain medium 108, and the second cladding 112 spaced apart from the substrate 102 by the air gap 106 and may thus function as the supports 114.

Each of the first and second support structures 116, 118, may include InP or other suitable material(s). In some examples, the first support structure 116 includes p-doped InP and the second support structure 118 includes n-doped InP. Alternatively or additionally, the substrate 102 may include InP.

An anode 120 may be formed on the first support structure 116. A cathode 122 may be formed on the second support structure 118. Current may be injected into the laser 100 through the anode 120, from which it may travel generally laterally through the waveguide 104, including through the gain medium 108, to the cathode 122.

Figure 2:
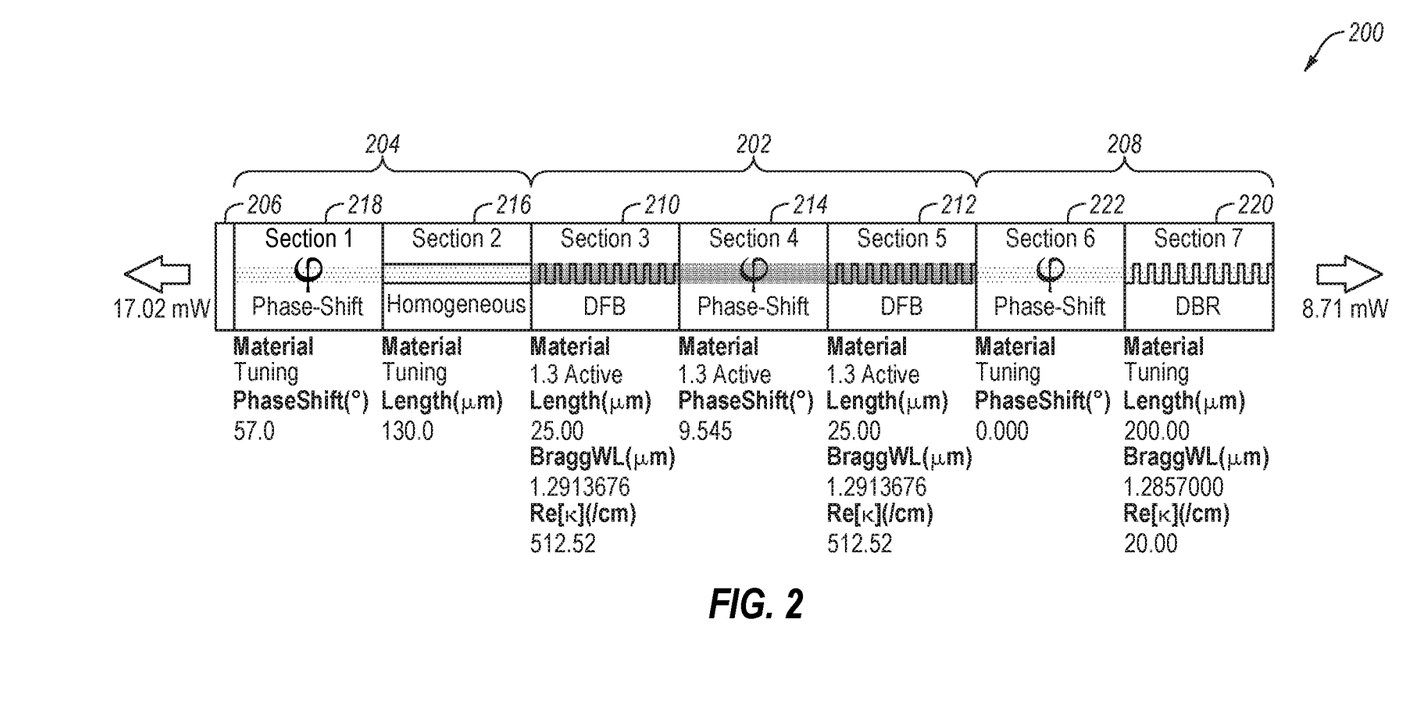
FIG. 2 is a block diagram of another example laser.

FIG. 2 is a block diagram of another example laser 200, arranged in accordance with at least one embodiment described herein. Although not shown in FIG. 2, the laser 200 may be formed generally in a waveguide spaced apart from a substrate to have strong optical confinement by air. For example, the laser 200 may generally be formed in the waveguide 104 spaced apart from the substrate 102 by the air gap 106 of FIG. 1.

The laser 200 includes an active section 202, a passive section 204 inline with the active section 202, and a LR mirror 206 formed at a front of the passive section 204. The laser 200 may also include a DBR section 208 inline with and behind the active section 202 such that the active section 202 is sandwiched between the passive section 204 and the DBR section 208.

The active section 202 may include one or more DFB grating sections, each with a DFB grating, such as two DFB grating sections 210, 212 separated by a phase shift 214 as illustrated in FIG. 2. In an example, the active section 202 may have a total length in a range from 40-120 micrometers. For example, the active section 202 may have a total length in a range from 40-70 micrometers for 160 GHz operation or in a range from 70-120 micrometers for 100 GHz operation. The two DFB grating sections 210, 212 may have the same or different lengths. In an example, each of the DFB grating sections has a length of 25 micrometers. Each of the DFB grating sections 210, 212 may have a grating strength κ of about 513 $cm^{-1}$, or a grating strength κ in a range from 250-530 $cm^{-1}$ or a range from 480-550 $cm^{-1}$ or other range. Alternatively or additionally, each of the DFB grating sections 210, 212 may have a Bragg wavelength of about 1.2913676 micrometers. More generally, each of the DFB grating sections 210, 212 may have a Bragg wavelength that is in a range from 0-6 nanometers longer than a center wavelength of a reflection profile of the DBR section 208. Alternatively or additionally, each of the DFB grating sections 210, 212 may have a Bragg wavelength that is in a range of plus or minus 2 nanometers from a wavelength at which the reflection profile of the DBR section 208 is 1 decibel lower than a peak of the reflection profile. The phase shift 214 may be about 9.545 degrees or other suitable phase shift that results in the lasing mode being aligned to the long wavelength edge of the DBR section 208.

The passive section 204 may include a passive waveguide 216 and a phase shift 218. The passive waveguide 216 may have a length of about 130 micrometers, or in a range from 110-150 micrometers or a range from 80-170 micrometers or other range. The phase shift 218 may be about 57 degrees, or in a range from 0-180 degrees or other range.

The LR mirror 206 may have a reflectivity of 9% or less, 7% or less, or even 5% or less, such as 4%, 3%, 2%, 1.4%, 1%, or other reflectivity. In some embodiments, the LR mirror 206 has a reflectivity in a range from 0.5% to 15% or in a range from 3% to 8%. The LR mirror 206 and a front portion of the DFB grating 210 may form an etalon in the laser 200.

The DBR section 208 may include a DBR grating 220 and a phase shift 222. In an example, the DBR section 208/DBR grating 220 may have a total length of 200 micrometers, or a length in a range from 100-200 micrometers or other range. The DBR section 208/DBR grating 220 may have a grating strength κ of about 20 cm$^{-1}$. More generally, the grating strength κ may be defined in terms of the product of κL where L is the length of the DBR section 208/DBR grating 220; in some embodiments, κL may be in a range from about 0.4 to 1.4 or other range. Alternatively or additionally, the DBR section 208/DBR grating 220 may have a Bragg wavelength of about 1.2857000 micrometers. More generally, the DBR section 208/DBR grating 220 may have a Bragg wavelength that is in a range from 0-6 nanometers shorter than the Bragg wavelength of the DFB grating sections 210, 212. Alternatively or additionally, the Bragg wavelength of the DBR section 208/DBR grating 220 may be defined relative to the Bragg wavelength of each of the DFB sections 210, 212: each of the DFB grating sections 210, 212 may have a Bragg wavelength that is in a range of plus or minus 2 nanometers from a wavelength at which the reflection profile of the DBR section 208 is 1 decibel lower than a peak (e.g., the Bragg wavelength of the DBR section 208/DBR grating 220) of the reflection profile. The phase shift 222 may be about 0 degrees, or in a range from 0 to 180 degrees or other range.

Figure 3:
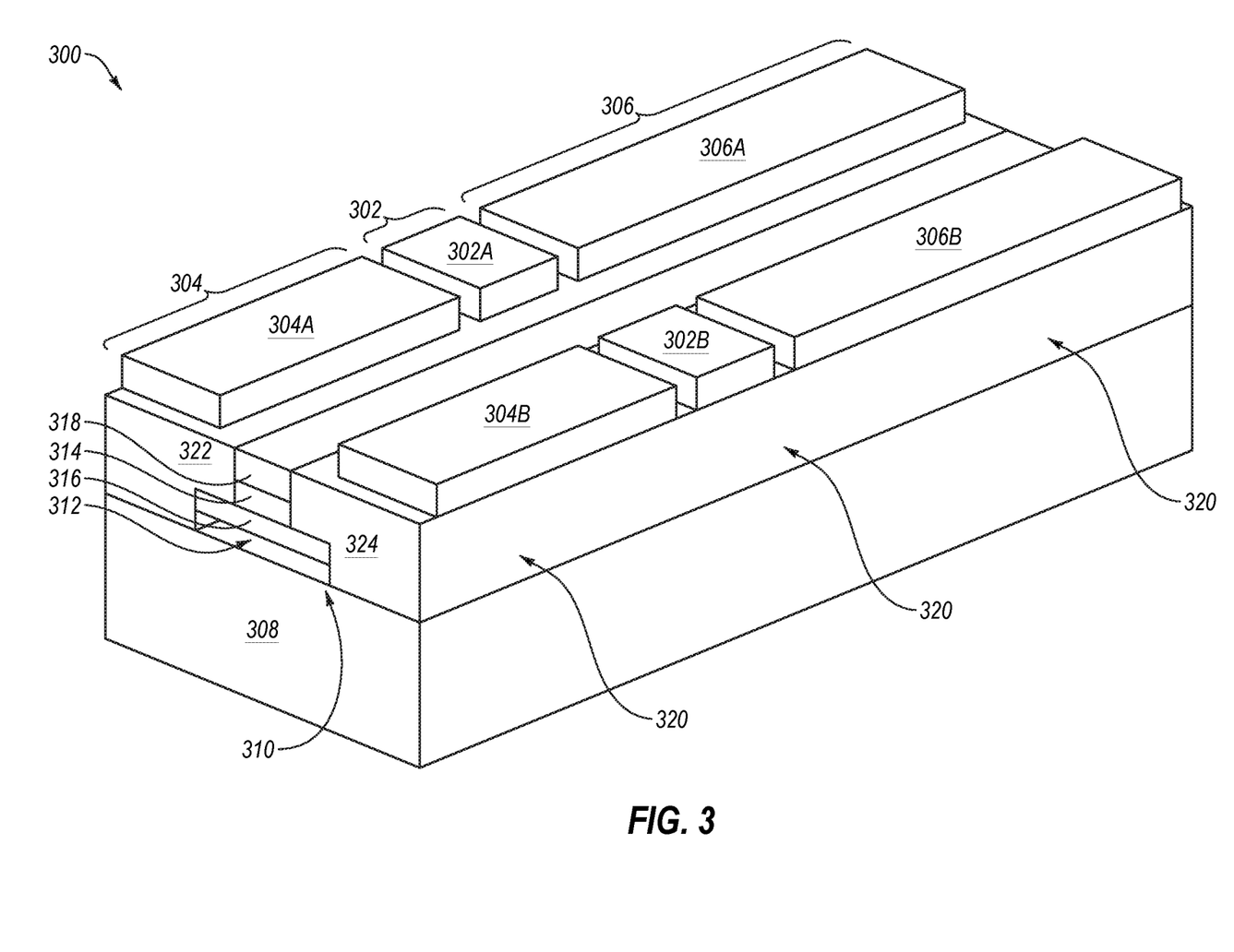
FIG. 3 is a top front perspective view of another example laser with strong optical confinement by air.

FIG. 3 is a top front perspective view of another example laser 300 with strong optical confinement by air, arranged in accordance with at least one embodiment described herein. The laser 300 may include, be included in, or correspond to either or both of the lasers 100, 200 of FIGS. 1 and 2.

The laser 300 may be implemented as a DR+R laser. Thus, the laser 300 may include an active section 302, a passive section 304 inline with the active section 302, and a LR mirror formed at a front of the passive section 304. The LR mirror is omitted from FIG. 3 for clarity. The laser 300 may also include a DBR section 306 inline with and behind the active section 302 such that the active section 302 is sandwiched between the passive section 304 and the DBR section 306. Each of the active section 302, the passive section 304, the LR mirror, and the DBR section 306 of the laser 300 may include, be included in, or correspond to, respectively, the active section 202, the passive section 204, the LR mirror 206, and the DBR section 208 of the laser 200. For example, the active section 302 may include one or more DFB gratings and the DBR section 306 may include one or more DBR gratings similar to the active section 202 and the DBR section 208 of FIG. 2.

Each of the active section 302, the passive section 304, and the DBR section 306 may include an anode 302A, 304A, 306A and a cathode 302B, 304B, 306B. The anode 302A and the cathode 302B of the active section 302 may respectively correspond to the anode 120 and the cathode 122 of FIG. 1. For example, current may be injected into the active section 302 of the laser 300 through the anode 302A, from which it may travel generally laterally through the active section 302 to the cathode 302B. Accordingly, a modulation signal in the form of a modulated current injection signal may be applied to the active section 302 through the anode 302A to the cathode 302B to modulate the active section 302. Modulation of the active section 302 may modulate the cavity loss of the laser 300 and may increase the relaxation oscillation frequency Jr of the laser 300.

A first bias signal may be applied to the passive section 304 through the anode 304A to the cathode 304B to bias the passive section 304. A second bias signal may be applied to the DBR section 306 through the anode 306A to the cathode 306B to bias the DBR section 306.

Alternatively or additionally, the laser 300 may include a substrate 308 and a waveguide 310 spaced apart from the substrate 308 by an air gap 312. The substrate 308 and the waveguide 310 may include, be included in, or correspond to, respectively, the substrate 102 and the waveguide 104 of FIG. 1. In an example, some or all of each of the active section 302, the passive section 304, and the DBR section 306 may be formed in the waveguide 310 spaced apart from the substrate 308.

The substrate 308 may include InP or other suitable material(s).

The waveguide 310 may include a gain medium 314, such as a MQW, positioned vertically within the waveguide 310 between first (or lower) and second (or upper) claddings 316, 318. The gain medium 314, the first cladding 316, and the second cladding 318 may include, be included in, or correspond to, respectively, the gain medium 108, the first cladding 110, and the second cladding 112 of FIG. 1. For example, each of the first and second claddings 316, 318 may have a thickness in a range from 0.05-0.15 micrometers.

The laser 300 may additionally include multiple supports 320, only some of which are visible and labeled in FIG. 3, first and second support structures 322, 324, and a dielectric layer 326. The supports 320 and the first and second support structures 322, 324 may include, be included in, or correspond to, respectively, the supports 114 and the first and second support structures 116, 118 of FIG. 1. For example, the supports 320 may be integrally formed in the first and second support structures 322, 324 on the waveguide 310.

FIGS. 4A-4J illustrate an example set of epitaxial processing steps to form a laser with strong optical confinement by air, arranged in accordance with at least one embodiment described herein. The laser formed according to FIGS. 4A-4J may include, be included in, or correspond to any of the lasers 100, 200, 300 of FIGS. 1-3.

Figure 4A:
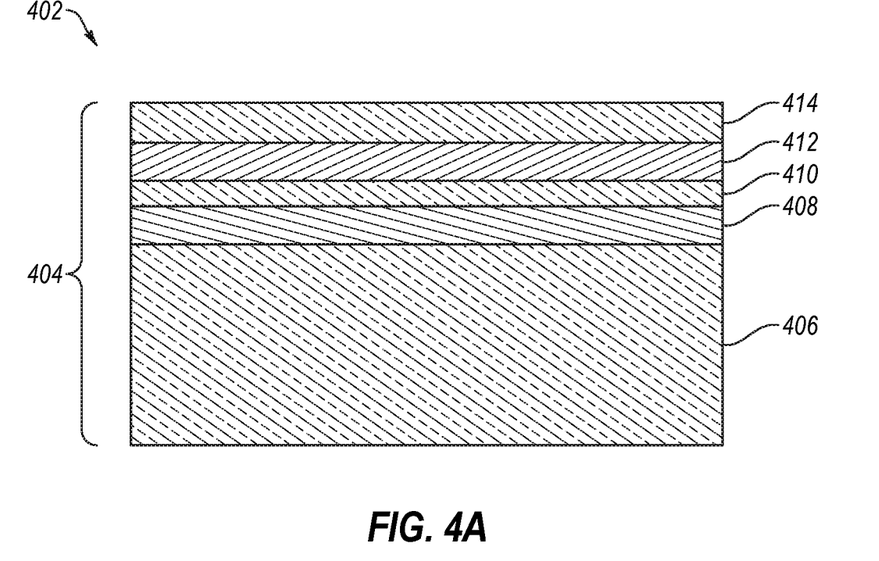
FIGS. 4A-4J illustrate an example set of epitaxial processing steps to form a laser with strong optical confinement by air.

Referring to FIG. 4A, at step 402, a material stack 404 may be built up. The material stack 404 may include a substrate 406, a sacrificial layer 408, a first or lower cladding layer 410, a gain medium layer 412, and a second or upper cladding layer 414.

The substrate 406 may include InP or other suitable material(s). The sacrificial layer 408 may include indium gallium aluminum arsenide (InGaAlAs), indium gallium arsenide (InGaAs) or other suitable material(s). The lower cladding layer 410 may include InP. The gain medium layer 412 may include indium gallium arsenide phosphide (InGaAsP) MQW or bulk layer, InGaAlAs MQW or bulk layer, gallium indium nitride arsenide (GaInNAs) MQW or bulk layer or other suitable material(s)/configurations. The upper cladding layer 414 may include InP. One or more of the foregoing layers may be doped or otherwise processed differently along different longitudinal sections (e.g., in and out of the page in FIG. 4A) depending on whether a given longitudinal section subsequently forms a part of an active section (such as the active section 302), a passive section (such as the passive section 304), or a DBR section (such as the DBR section 306). The doping or other processing may be implemented as the layers of the material stack 404 or built up or after the entire material stack 404 is built up. For example, one or more DFB gratings may be written in one or more of the lower cladding 410, the gain medium 412, or the upper cladding 414 in a longitudinal section that subsequently forms the active section before subsequent layers are formed thereon.

Figure 4B:
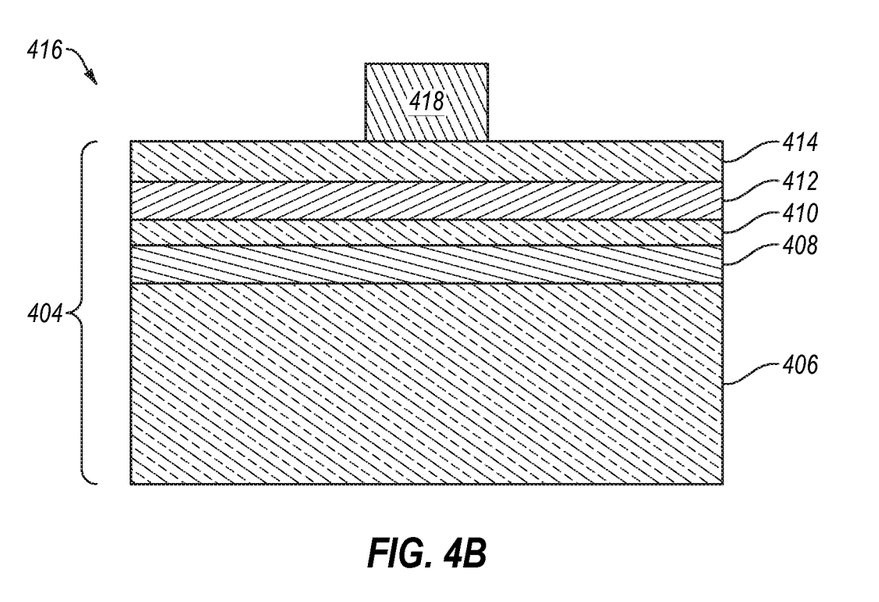

Referring to FIG. 4B, at step 416, a thick dielectric layer 418, such as a layer of $SiO_2$ with a thickness of about 0.4-1 micrometers, may be formed on the upper cladding layer 414. The thick dielectric layer 418 is formed where a ridge structure is formed in subsequent steps. The thick dielectric layer 418 may have a width of about 0.8 micrometers. The width of the thick dielectric layer 418 may define a width of the gain medium 412 of the laser formed according to FIGS. 4A-4J.

Figure 4C:
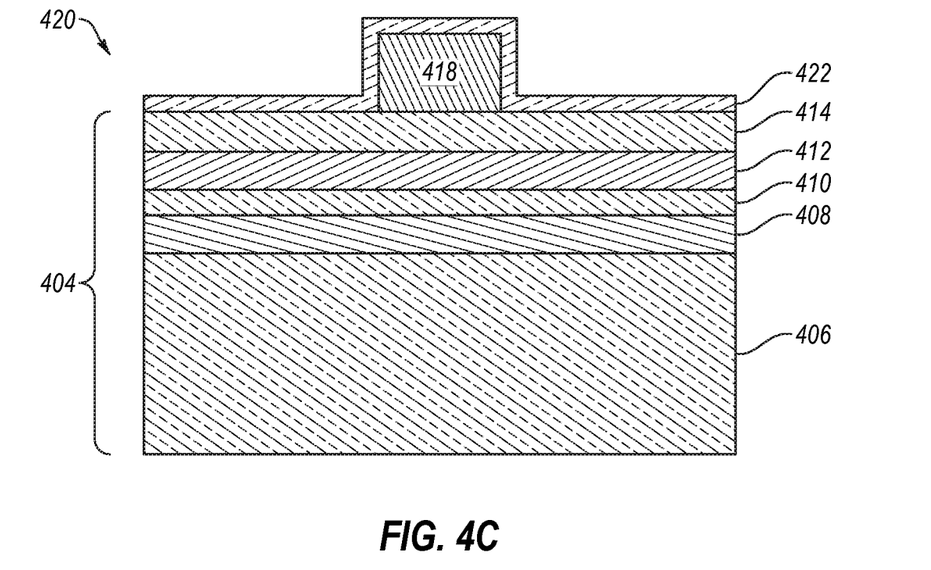

Referring to FIG. 4C, at step 420, a thin dielectric layer 422, such as a layer of $SiO_2$ with a thickness of about 0.05-0.2 micrometers, may be formed on the upper cladding layer 414 and the thick dielectric layer 620.

Figure 4D:
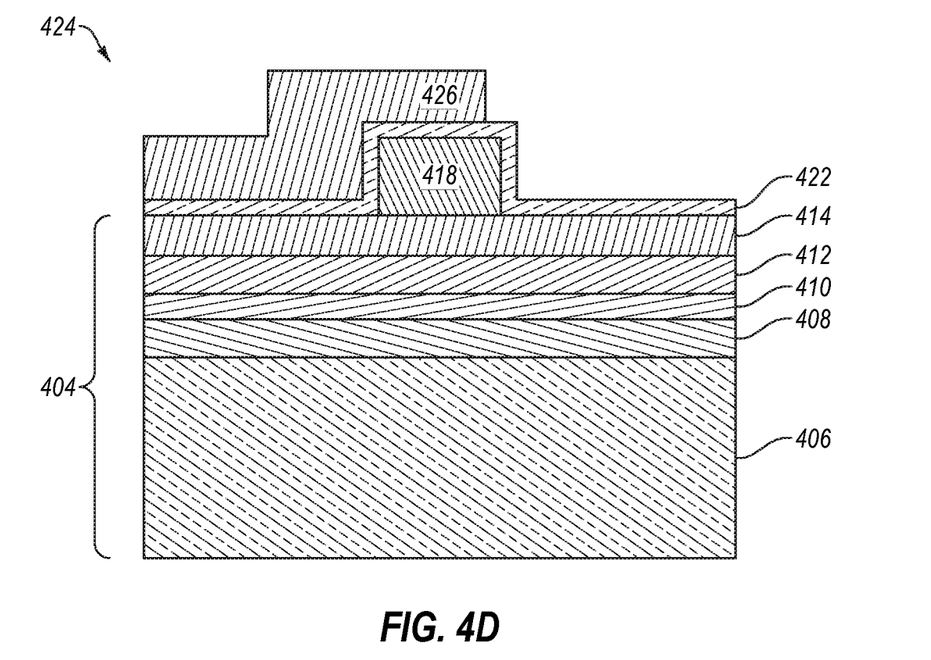

Referring to FIG. 4D, at step 424, a photoresist 426 is selectively applied to the thin dielectric layer 422.

Figure 4E:
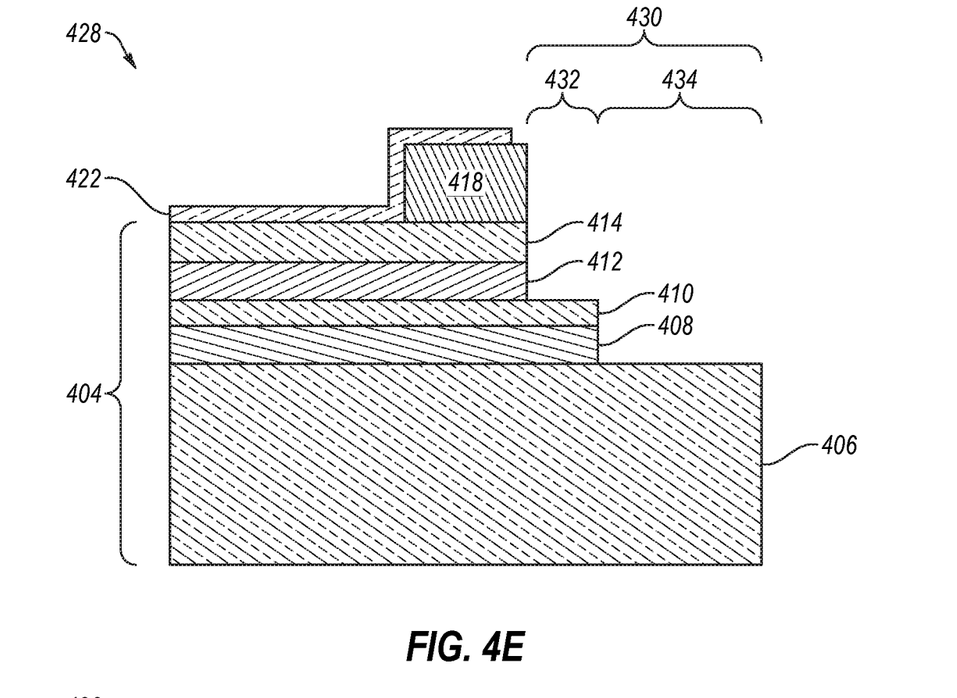

Referring to FIG. 4E, at step 428, the material stack 404 is partially etched in areas not covered by the photoresist 426 in FIG. 4D and the photoresist 426 is removed. The etching in some embodiments may include two or more etching steps to etch partially through the material stack 404 to different depths in different areas. For example, one etching step may etch through the upper cladding layer 414 and the gain medium layer 412 in an area 430. Another photoresist (not shown) may then be applied to an area 432. Next, a second etching step may etch through the lower cladding layer 410 and the sacrificial layer 408 in an area 434. After completion of etching the photoresist is removed.

Figure 4F:
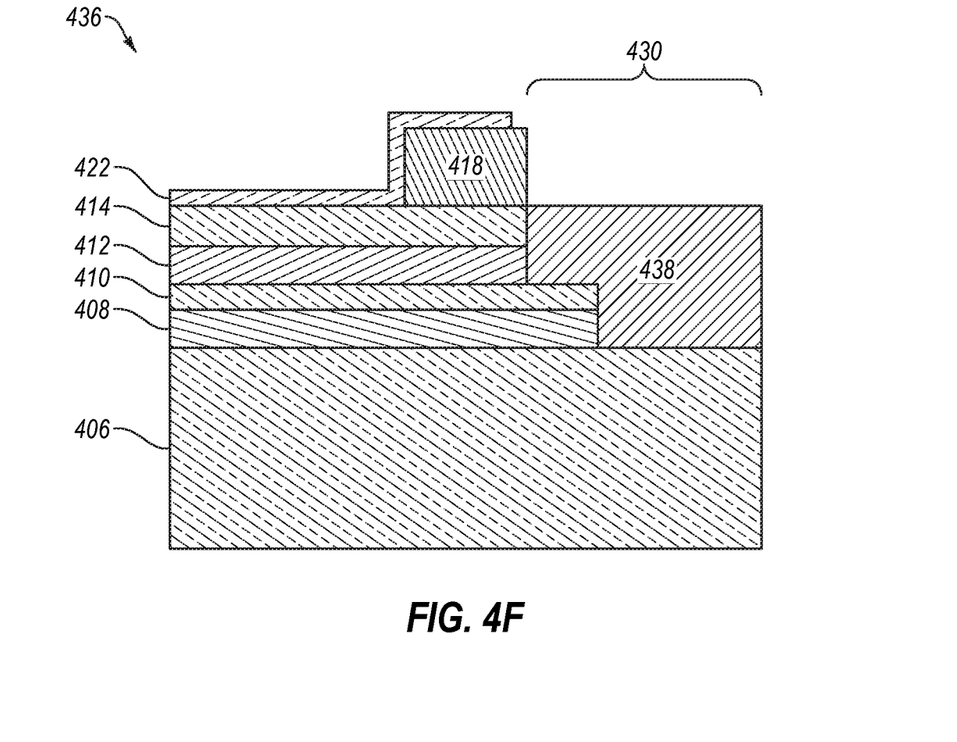

Referring to FIG. 4F, at step 436, support structure 438 is formed in the area 430. The support structure 438 may include doped InP, such as n-doped InP. The support structure 438 may include, be included in, or correspond to the second support structure 118, 324 of FIG. 1 or 3.

Figure 4G:
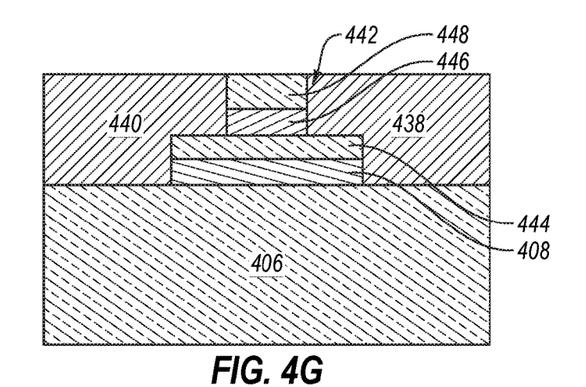

Following step 436 of FIG. 4F, at least some portions of one or more of steps 424, 428, 436 of FIGS. 4D-4F, e.g., photoresist, etching, and formation of a support structure 440, may be repeated on an opposite side of the thick dielectric layer 418 to form a waveguide 442 illustrated in FIG. 4G with support structures 438, 440 on opposite sides thereof. In addition, as shown in FIG. 4G, after formation of the waveguide 442, the thick dielectric layer 418 may be removed. As further illustrated in FIG. 4G, the waveguide 442 includes a first or lower cladding 444 formed from the lower cladding layer 410, a gain medium 446 formed from the gain medium layer 412, and a second or upper cladding 448 formed from the upper cladding layer 414. The support structure 440, the waveguide 442, the first cladding 444, the gain medium 446, and the second cladding 448 may include, be included in, or correspond to, respectively, the first support structure 116, 322, the waveguide 104, the first cladding 110, 316, the gain medium 108, 314, and the second cladding 112, 318 of FIG. 1 or 3.

Figure 4H:
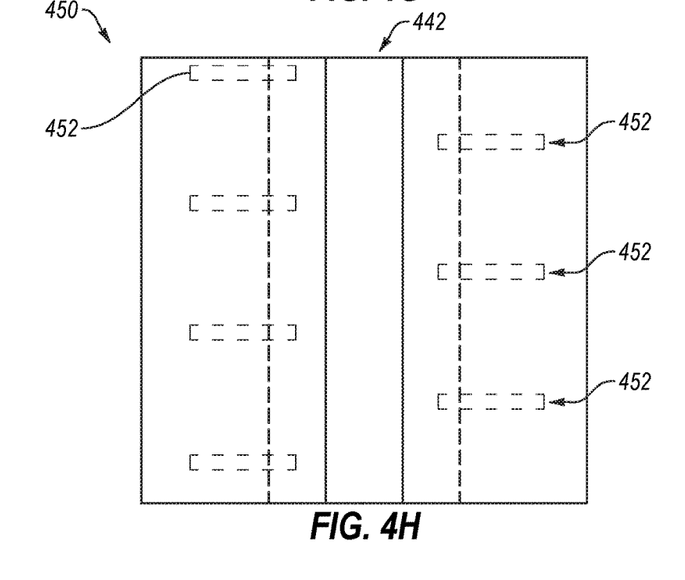

Referring to FIG. 4H, which includes an overhead view of FIG. 4G, at step 450, various dry etched holes 452 (only some of which are labeled for simplicity) are formed through portions of the support structures 438, 440 and the first cladding 444 into the remaining sacrificial layer 408.

In FIG. 4H, dashed lines that intersect the dry etched holes 452 represent the lateral extent of the first cladding 444 and the remaining sacrificial layer 408. Solid lines between and parallel to the dashed lines represent the lateral extent of the gain medium 446 and the second cladding 448. It can be seen from FIG. 4H that the locations of the dry etched holes 452 may be positioned to intersect and expose the remaining sacrificial layer 408 without intersecting or exposing any of the gain medium 446 or the second cladding 448.

Figure 4I:
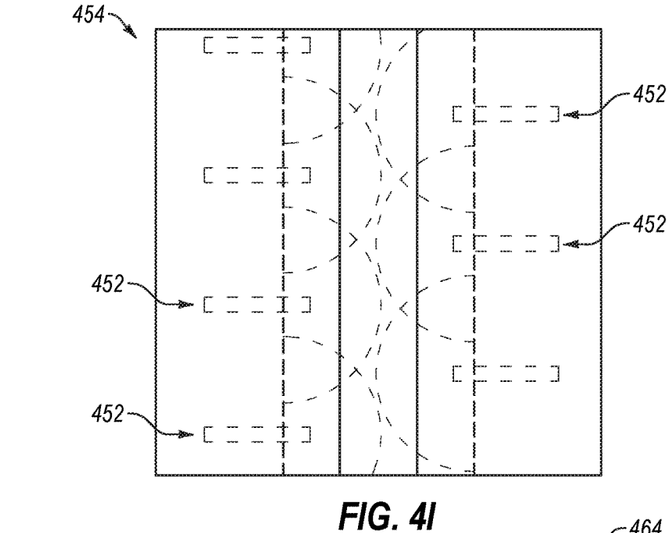
Figure 4J:
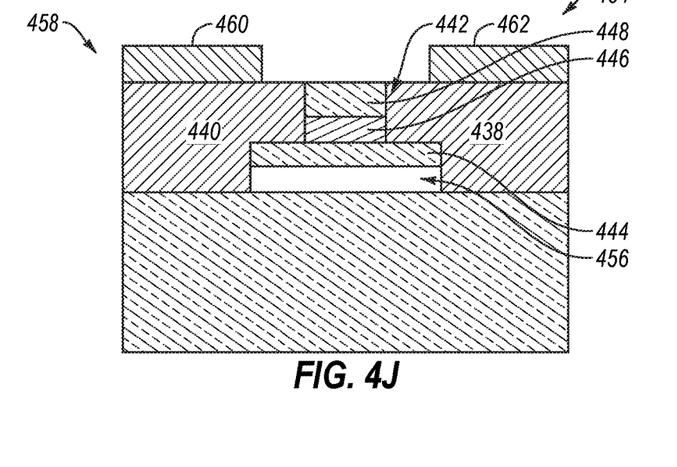

Referring to FIG. 4I, at step 454, the remaining sacrificial layer 408 (FIG. 4G) may be removed, e.g., by exposing the remaining sacrificial layer 408 to a selective etchant through the dry etched holes 452 to etch away the remaining sacrificial layer 408 beneath the first cladding 444 and form an air gap 456 illustrated in FIG. 4J. In an example, the entire structure of FIGS. 4G and 4H may be dipped in the selective etchant to allow the selective etchant to enter the dry etched holes 452 and etch away the remaining sacrificial layer 408. Because the dry etched holes 452 do not intersect or expose the gain medium 446, the gain medium 446 is protected against exposure to the selective etchant.

FIG. 4I includes a dashed arc that emanates from each of the dry etched holes 452. The dashed arcs represent the etch paths through the remaining sacrificial layer 408 from the dry etched holes 452. In general, the selective etchant may etch isotropically through the remaining sacrificial layer 408 from the dry etched holes 452.

Referring to FIG. 4J, at step 458, one or more anodes 460 and one or more cathodes 462 may be formed on the current structures 438, 440. For example, similar to anodes 302A, 304A, 306A and cathodes 302B, 304B, 306B in FIG. 3, a first one of anode 460 and a first one of cathode 462 may be formed in a first longitudinal section that is or will be an active section, a second one of anode 460 and a second one of cathode 462 may be formed in a second longitudinal section that is or will be a passive section, and a third one a anode 460 and a third one of cathode 462 may be formed in a third longitudinal section that is or will be a DBR section. Due to the cross-sectional view of FIG. 4J being take in a plane normal to a length of a laser 464 formed according to FIGS. 4A-4J, only one anode 460 and one cathode 462 are visible in FIG. 4J.

In some embodiments, metallization that forms the anode 460 and the cathode 462 may partially or completely fill the dry etched holes 452 during formation of the anode 460 and the cathode 462.

Multiple areas of a semiconductor wafer may be processed simultaneously according to the foregoing steps of FIGS. 4A-4J to form multiple lasers 464 (FIG. 4J) in the wafer. The lasers 464 may be singulated from the wafer, e.g., by dicing or cleaving. Alternatively or additionally, one or more LR or HR mirrors may be formed on cleaved facets of each of the lasers 464 to complete formation of the lasers 464. For example, a LR mirror may be formed on a front of a passive section of each of the lasers 464.

Figure 5:
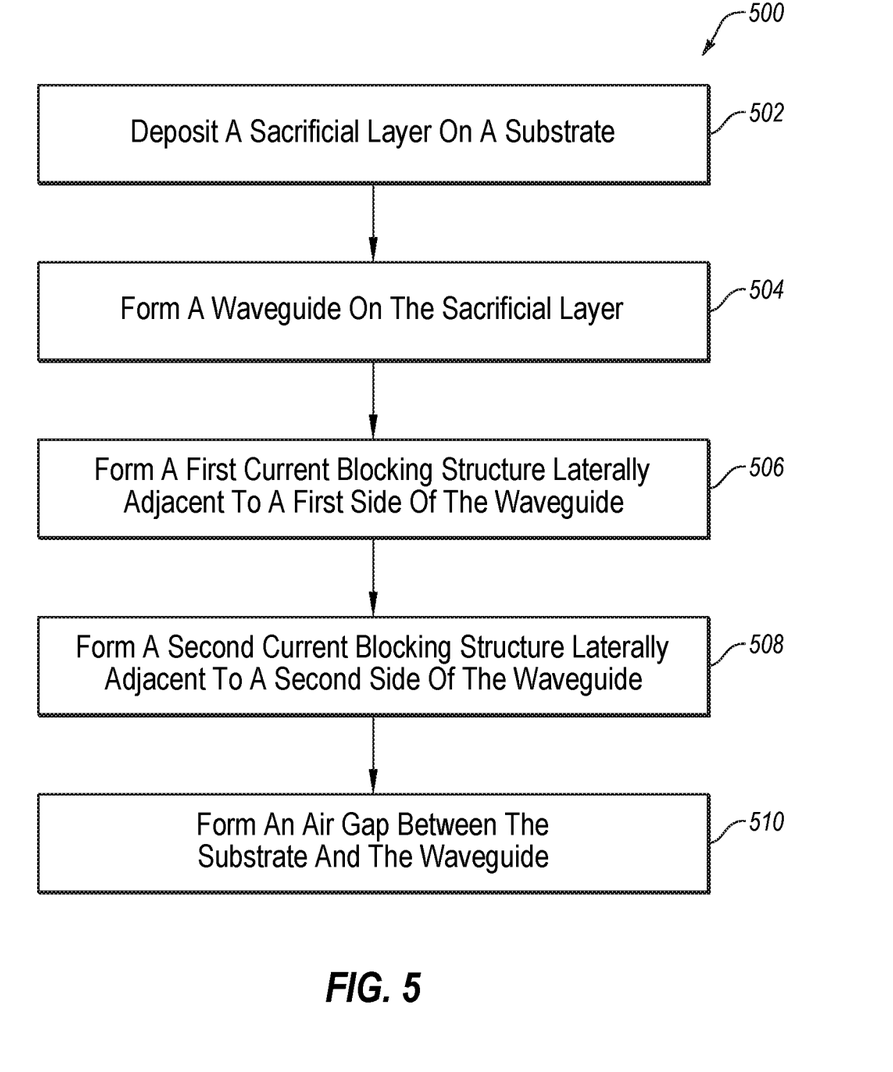
FIG. 5 is a flowchart of an example method to form a laser.

FIG. 5 is a flowchart of an example method 500 to form a laser, arranged in accordance with at least one embodiment described herein. Specifically, the method 500 may form a laser with strong optical confinement by air. The method 500 may include one or more of blocks 502, 504, 506, 508, or 510. The method may begin at block 502.

At block 502, the method 500 may include depositing a sacrificial layer on a substrate. Block 502 may be performed as part of step 402 of FIG. 4A, for example. Block 502 may be followed by block 504.

At block 504, the method 500 may include forming a waveguide on the sacrificial layer. The waveguide may include first (or lower) and second (or upper) claddings and a gain medium positioned between the first and second claddings. Block 504 may be performed as part of step 402 of FIG. 4A. For example, forming the waveguide on the sacrificial layer at block 504 may include: depositing a first cladding layer that includes the first cladding on the sacrificial layer; depositing a gain medium layer that includes the gain medium on the first cladding layer; and depositing a second cladding layer that includes the second cladding on the gain medium layer as part of step 402 in which the material stack 404 of FIG. 4A is built up.

In some embodiments, depositing the first cladding layer on the sacrificial layer includes depositing the first cladding layer with a thickness in a range from 0.05-0.15 micrometers on the sacrificial layer. Alternatively or additionally, depositing the second cladding layer on the gain medium layer includes depositing the second cladding layer with a thickness in a range from 0.05-0.15 micrometers on the gain medium layer.

Alternatively or additionally, forming the waveguide at block 504 may include one or more portions or all of at least one of the steps 424, 428, 436, of FIGS. 4D-4F. For example, forming the waveguide on the sacrificial layer may further include forming a first lateral boundary of the first cladding by vertically etching through the second cladding layer, the gain medium layer, the first cladding layer, and the sacrificial layer to the substrate in a first region of a material stack that includes the substrate, the sacrificial layer, the first cladding layer, the gain medium layer, and the second cladding layer. Forming the waveguide may further include forming a first lateral boundary of the second cladding and the gain medium by vertically etching through the second cladding layer and the gain medium layer to the first cladding in a second region of the material stack that is adjacent to the first region. Forming the waveguide may further include forming a second lateral boundary of the first cladding by vertically etching through the second cladding layer, the gain medium layer, the first cladding layer, and the sacrificial layer to the substrate in a third region of the material stack that is spaced apart from the first and second regions. Forming the waveguide may further include forming a second lateral boundary of the second cladding and the gain medium by vertically etching through the second cladding layer and the gain medium layer to the first cladding in a fourth region of the material stack that is adjacent to the third region. In these and other embodiments, the first side of the waveguide includes the first lateral boundary of the first cladding and the first lateral boundary of the second cladding and the gain medium; the second side of the waveguide includes the second lateral boundary of the first cladding and the second lateral boundary of the second cladding and the gain medium; and a first distance between the first and second lateral boundaries of the first cladding is greater than a second distance between the first and second lateral boundaries of the second cladding and the gain medium.

Block 504 may be followed by block 506.

At block 506, the method 500 may include forming a first support structure laterally adjacent to a first side of the waveguide. Block 506 may include or be included in step 436 of FIG. 4F. Block 506 may be followed by block 508.

At block 508, the method 500 may include forming a second support structure laterally adjacent to a second side of the waveguide that is opposite the first side of the waveguide. Block 508 may be followed by block 510.

At block 510, the method may include forming an air gap between the substrate and the waveguide by selectively etching the sacrificial layer through holes that pass through a corresponding one of the first and second support structures to the sacrificial layer. Block 510 may include or be included in step 454 of FIG. 4I.

The method 500 may further include dry etching the holes vertically through the corresponding one of the first and second support structures to the sacrificial layer to intersect material of the sacrificial layer without intersecting material of the gain medium. In some embodiments, each of the holes at vertical levels of the gain medium and the second cladding is completely bounded by the corresponding one of the first and second support structures such that none of the holes intersects material of the gain medium or the second cladding.

Figure 6:
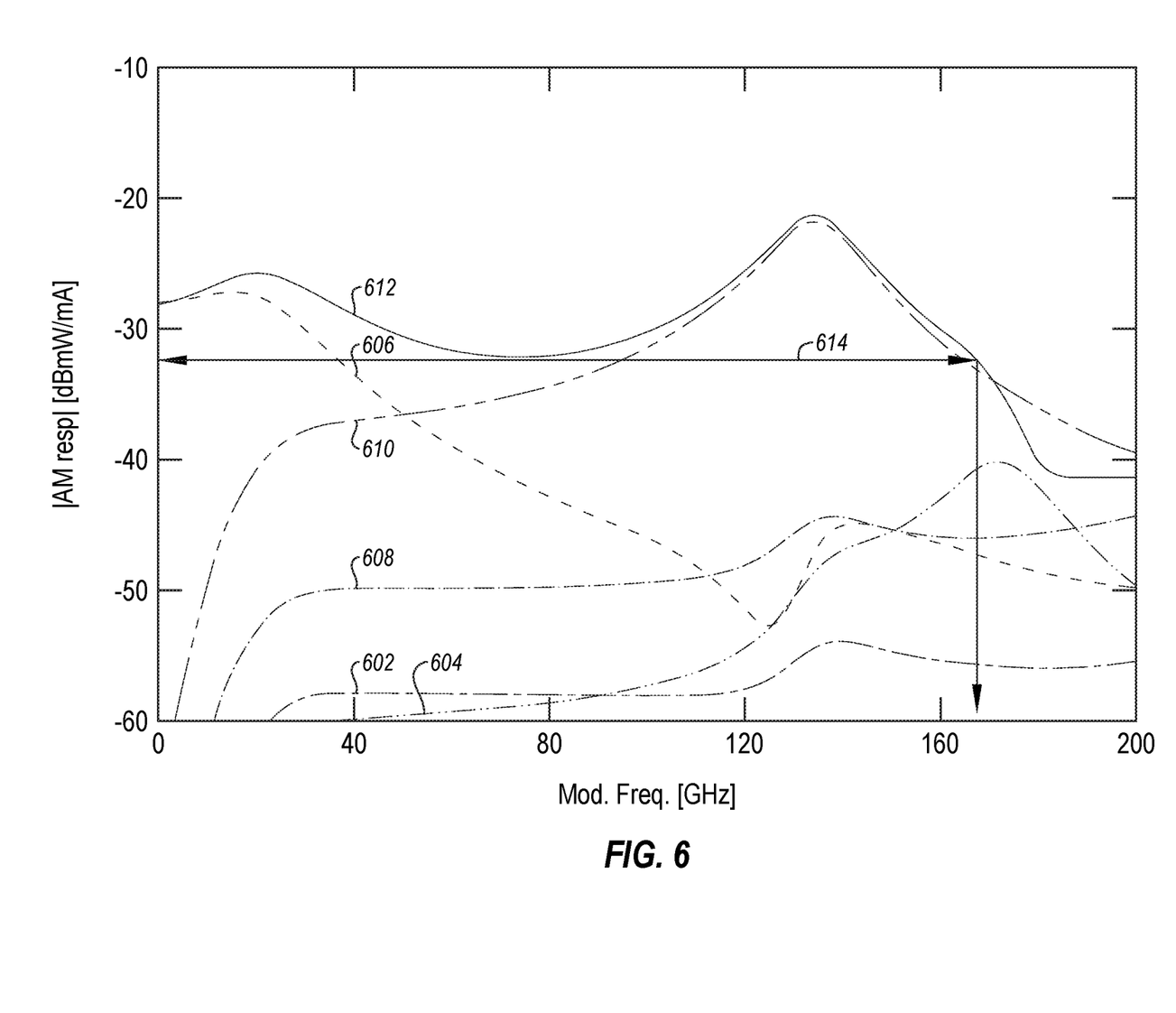
FIG. 6 illustrates a simulated S21 response of an example laser as a function of modulation frequency.

Modifications, additions, or omissions may be made to the method 500 without departing from the scope of the present disclosure. For example, the operations of method 500 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the described embodiments FIG. 6 illustrates a simulated S21 response of an example laser as a function of modulation frequency (Mod.Freq.), arranged in accordance with at least one embodiment described herein. The laser may have strong optical confinement by air and may have a DR+R cavity design (hereinafter the DR+R laser with strong optical confinement) such as disclosed with respect to FIGS. 2 and 3. The horizontal axis is modulation frequency in units of GHz. The vertical axis is amplitude modulation (AM) response (resp.) in units of decibel milliwatts (dBmW) per milliamp (mA). Curve 612 simulates a summation of contributions from all modes of the DR+R laser with strong optical confinement. Curve 606 simulates a contribution of a main lasing mode of the DR+R laser. Curve 610 simulates a contribution of a strongest side mode of the DR+R laser which is the main contribution of the PPR effect. The remaining curves 602, 604, 608 simulate contributions of other, weaker, side modes of the DR+R laser. It can be seen from curve 612 that the laser with strong optical confinement by air and the DR+R laser cavity design has a simulated 3-dB bandwidth 614 that is greater than 160 GHz.

Figure 7:
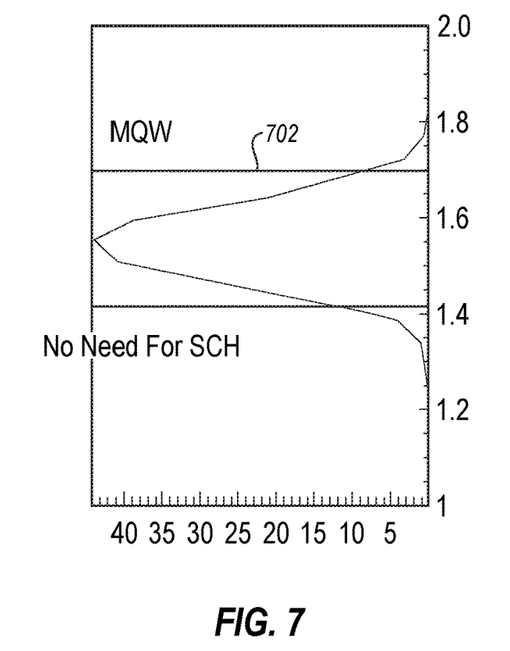
FIG. 7 illustrates a simulated optical mode in a vertical direction of an example laser with strong optical confinement by air.

FIG. 7 illustrates a simulated optical mode in a vertical direction of an example laser with strong optical confinement by air, arranged in accordance with at least one embodiment described herein. The laser may also have a DR+R laser cavity design. A cross-section through a MQW or gain medium of the laser is designated in FIG. 7 at 702. In FIG. 7, the vertical axis is thickness in micrometers and the horizontal axis is optical mode intensity profile in arbitrary units. As illustrated in FIG. 7, the optical mode is substantially confined vertically within the MQW.

Figure 8:
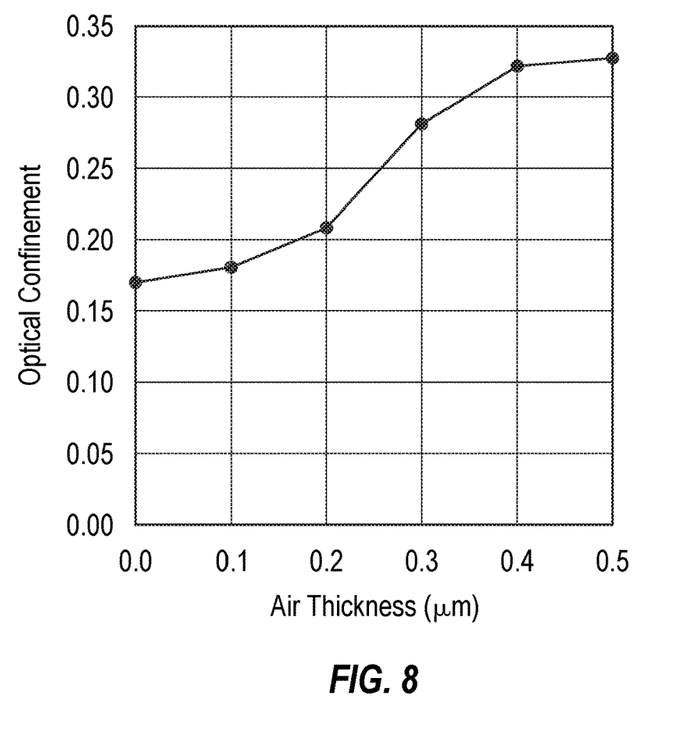
FIG. 8 illustrates simulated optical confinement as a function of air gap thickness for an example laser with strong optical confinement by air, all arranged in accordance with at least one embodiment described herein.

FIG. 8 illustrates simulated optical confinement as a function of air gap thickness for an example laser with strong optical confinement by air, arranged in accordance with at least one embodiment described herein. The laser may also have a DR+R laser cavity design. FIG. 8 specifically simulates optical confinement in the vertical or transverse direction of the laser. Optical confinement is along the vertical axis of FIG. 8 and air thickness is along the horizontal axis in units of micrometers. The air thickness in FIG. 8 refers to the thickness of a corresponding air gap of the laser between a corresponding substrate and a corresponding waveguide. In the simulation of FIG. 8, first and second claddings of the waveguide, e.g., below and above a corresponding gain medium of the waveguide, are assumed to have a thickness of 0.1 micrometers each. It can be seen from FIG. 8 that optical confinement in the vertical direction significantly increases when the air gap thickness is increased from 0.2 micrometers to 0.3 micrometers. Accordingly, in some embodiments described herein, the thickness of the air gap between the substrate and the waveguide, and more particularly between the substrate and the first or lower cladding of the waveguide, may be at least 0.3 micrometers. Further, the optical confinement in the vertical direction for an air gap thickness of 0.4 micrometers is almost double the optical confinement in the vertical direction for an air gap thickness of 0 micrometers (e.g., no air gap).

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A laser, comprising:
a substrate;
a first cladding spaced apart from the substrate by an air gap, wherein a thickness of the first cladding in a vertical direction is in a range from 0.05-0.15 micrometers;
a gain medium disposed on the first cladding opposite the air gap;
a second cladding disposed on the gain medium opposite the first cladding, wherein a thickness of the second cladding in the vertical direction is in a range from 0.05-0.15 micrometers; and
a plurality of supports coupled to each of the substrate, the first cladding, the gain medium, and the second cladding to retain the first cladding, the gain medium, and the second cladding spaced apart from the substrate,
wherein the air gap is between the substrate, the plurality of supports, and the first cladding, and
wherein a width of the air gap extending between the plurality of supports in a horizontal direction is the same as a width of the first cladding between the plurality of supports in the horizontal direction.

2. The laser of claim 1, further comprising:
a first support structure positioned laterally adjacent to a first side of the first cladding, the gain medium, and the second cladding; and
a second support structure positioned laterally adjacent to a second side of the first cladding, the gain medium, and the second cladding.

3. The laser of claim 2, wherein the plurality of supports are integrally formed in the first and second support structures.

4. The laser of claim 2, further comprising an anode formed on the first support structure and a cathode formed on the second support structure to laterally inject current through the gain medium.

5. The laser of claim 1, wherein:
the first cladding, the gain medium, and the second cladding form a waveguide; and
the waveguide includes an active section, a passive section inline with the active section, and a low reflection (LR) mirror formed at a front of the passive section.

6. The laser of claim 5, wherein the active section includes a distributed feedback (DFB) grating.

7. The laser of claim 6, wherein the waveguide further includes a distributed Bragg reflector (DBR) section inline with and behind the active section.

8. The laser of claim 5, wherein the LR mirror has a reflectivity of 15% or less.

9. The laser of claim 8, wherein the LR mirror has a reflectivity in a range from 3% to 8%.

10. The laser of claim 1, wherein a thickness of the air gap between the substrate and the first cladding is at least 0.3 micrometers.

11. A laser, comprising:
a substrate;
a waveguide spaced apart from the substrate by an air gap, wherein the waveguide includes:
a distributed feedback (DFB) active section;
a passive section inline with the DFB active section;
a distributed Bragg reflector (DBR) section inline with the DFB active section, the DFB active section positioned between the passive section and the DBR section;
a low reflection (LR) mirror formed at a front of the passive section of the waveguide;
a first cladding spaced apart from the substrate by the air gap;
a gain medium disposed on the first cladding opposite the air gap; and
a second cladding disposed on the gain medium opposite the first cladding,
wherein the air gap is disposed in each of the DFB active section, the passive section, and the DBR section; and
a plurality of support structures, each coupled to the substrate and the waveguide, wherein the plurality of support structures are positioned laterally adjacent to opposing sides of the waveguide and overlap the first cladding.

12. The laser of claim 11, wherein the LR mirror has a reflectivity in a range from 3% to 8%.

13. The laser of claim 11, wherein the waveguide includes, in each of the DFB active section, the passive section, and the DBR section:
the first cladding,
the gain medium, and
the second cladding.

14. The laser of claim 13, wherein:
a thickness of the first cladding in a vertical direction is in a range from 0.05-0.15 micrometers; and
a thickness of the second cladding in the vertical direction is in a range from 0.05-0.15 micrometers.

15. The laser of claim 11, wherein the plurality of supports are coupled to each of the substrate and the waveguide to support the waveguide spaced apart from the substrate.

16. The laser of claim 11, wherein a thickness of the air gap between the substrate and the waveguide is at least 0.3 micrometers.

17. The laser of claim 11, wherein the plurality of support structures are configured to laterally inject electrical current to the waveguide.

18. The laser of claim 17, wherein the air gap is between the substrate, the plurality of support structures, and the waveguide.

19. A method to form a laser, the method comprising:
depositing a sacrificial layer on a substrate;
forming a waveguide on the sacrificial layer, the waveguide including a first cladding, a second cladding, and a gain medium positioned between the first cladding and the second cladding;
forming a first support structure laterally adjacent to a first side of the waveguide and overlapping a first portion of the first cladding;
forming a second support structure laterally adjacent to a second side of the waveguide that is opposite the first side of the waveguide and overlapping a second portion of the first cladding; and
forming an air gap between the substrate and the waveguide by selectively etching the sacrificial layer through holes that pass through a corresponding one of the first and second support structures to the sacrificial layer,
wherein, during the selectively etching the sacrificial layer, the first cladding is exposed to the air gap and one of the gain medium and the second cladding remains unexposed to the air gap.

20. The method of claim 19, wherein forming the waveguide on the sacrificial layer includes:
depositing a first cladding layer that includes the first cladding on the sacrificial layer;
depositing a gain medium layer that includes the gain medium on the first cladding layer; and
depositing a second cladding layer that includes the second cladding on the gain medium layer.

21. The method of claim 20, wherein:
depositing the first cladding layer on the sacrificial layer includes depositing the first cladding layer with a thickness in a range from 0.05-0.15 micrometers on the sacrificial layer; and
depositing the second cladding layer on the gain medium layer includes depositing the second cladding layer with a thickness in a range from 0.05-0.15 micrometers on the gain medium layer.

22. The method of claim 19, further comprising dry etching the holes vertically through the corresponding one of the first and second current blockin support structures to the sacrificial layer to intersect material of the sacrificial layer without intersecting material of the gain medium.

23. The method of claim 19, wherein the air gap is between the substrate, the first support structure, the second support structure, and the first cladding.

* * * * *